United States Patent [19]
Yaklin

[11] Patent Number: 5,465,075
[45] Date of Patent: Nov. 7, 1995

[54] PHASE-LOCKED LOOP CIRCUIT WITH MINIMUM OUTPUT JITTER AND MAXIMUM FREQUENCY STABILITY

[75] Inventor: Daniel A. Yaklin, Garland, Tex.

[73] Assignee: Texas Instruments Incorporated, Dallas, Tex.

[21] Appl. No.: 176,616

[22] Filed: Jan. 3, 1994

[51] Int. Cl.⁶ .................................................. H03L 7/089
[52] U.S. Cl. ................................ 331/8; 331/57; 331/34; 331/17
[58] Field of Search .................................. 307/603, 296.5, 307/296.3; 331/17, 8, 25, 34, 57, 108 C, 172, 173

[56] References Cited

U.S. PATENT DOCUMENTS 5,168,245 12/1992 Koskowich ............................. 331/1 A
5,247,265 9/1993 Norimatsu ................................ 331/16

OTHER PUBLICATIONS

IBM Technical Disclosure Bulletin, "Voltage–Controlled Oscillator", vol. 33 No. 10A, 1991, pp. 286–288.

Primary Examiner—Robert J. Pascal
Assistant Examiner—David Vu
Attorney, Agent, or Firm—Robby I. Holland; Wade James Brady, II; Richard L. Donaldson

[57] ABSTRACT

A compact PLL circuit (100) and method of operation are provided which include a phase/frequency detector circuit (102), a control voltage generating circuit (110), and a VCO circuit (108) including at least one delay buffer circuit (118). A transmission gate (M3, M4) is arranged in series with each delay element (M5, M6) in the VCO circuit (108). A plurality of "power down" transistors (M3, M8–M9, M13–M16) are arranged strategically in the control circuit (110), and a "power down" transistor (M7) is arranged strategically in at least one delay buffer circuit (118). A filter arrangement (R1, R2, C) is included in the control circuit (110). Consequently, a relatively compact PLL circuit design is provided in which output jitter is minimized, the overall stability of the PLL is maximized, and only leakage current is drawn from the PLL circuit (100) during a "power down" mode of operation.

10 Claims, 7 Drawing Sheets

DLAYBUF_PD (3)

*FIG. 7*

PLLOBUF

PHASE-LOCKED LOOP CIRCUIT WITH MINIMUM OUTPUT JITTER AND MAXIMUM FREQUENCY STABILITY

TECHNICAL FIELD OF THE INVENTION

This invention relates generally to electronic circuits, and more particularly, to a phase-locked loop circuit and method of operation.

BACKGROUND OF THE INVENTION

In designing phase-locked loops ("PLLs") for semiconductor integrated circuits ("ICs"), a goal is to minimize "jitter" at the output of the PLL. Typically, in a PLL circuit that uses a voltage-controlled oscillator ("VCO") to generate the PLL's output signal, noise picked up by the VCO on the input control lines is a major cause of such jitter. Another goal in designing PLLs for semiconductor ICs, is to maximize the stability of the PLL's control circuit and, therefore, maximize the overall frequency stability of the PLL. Essentially, additional circuitry is needed in the PLL to reduce jitter and increase the frequency stability of the output signal. However, an overriding goal in designing PLLs for semiconductor ICs is to keep the size of the PLL circuit as compact as possible, which translates to a requirement to minimize the number of transistors and components used in the overall PLL circuit. Therefore, it has been difficult to implement an appreciable reduction in output jitter and increase in frequency stability in a compact PLL circuit design for a semiconductor IC.

An additional semiconductor IC design goal is to minimize power consumption of the PLL circuit during a "power down" situation when the circuit is not activated. Essentially, unless the PLL's transistors are actively and completely shut down during "power down," an excessive amount of current may be drawn from the circuit by an external load. Since additional circuitry is needed to turn off the PLL's transistors completely, it has long been difficult to implement such a "power down" capability in a compact circuit design.

SUMMARY OF THE INVENTION

Accordingly, a need exists in the semiconductor integrated circuit manufacturing industry for a compact PLL circuit that minimizes output jitter, maximizes frequency stability, and minimizes "power draw" during a "power down" operation of the circuit. In accordance with the present invention, a relatively compact PLL circuit and method of operation are provided which include a phase/frequency detector circuit, a control voltage generating circuit, and a VCO circuit including at least one delay buffer circuit. A transmission gate is arranged in series with each delay element in the VCO circuit. A plurality of "power down" transistors are arranged strategically in the control circuit and in at least one delay buffer circuit. A filter arrangement may be included in the control circuit for stability.

An important technical advantage of the present invention is that the VCO circuit's gain may be selected at the minimum gain required to lock the PLL over a predetermined range of process and operating conditions, which minimizes jitter caused by noise input to the VCO via the control voltage lines. Also, by minimizing the VCO circuit's gain, the VCO will continue to oscillate even if the control voltages are set to a rail. Another important technical advantage of the present invention is that the PLL circuit may be powered down, and the only current drawn from the circuit will be leakage current. Yet another technical advantage of the invention is that the stability of the control voltage circuit may be increased, which increases the overall stability of the PLL. An additional, important technical advantage of the invention is that the above-described technical advantages may be achieved with a relatively compact PLL circuit design.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1–9 of the drawings, like numerals being used for like and corresponding parts of the various drawings.

Figure 1:
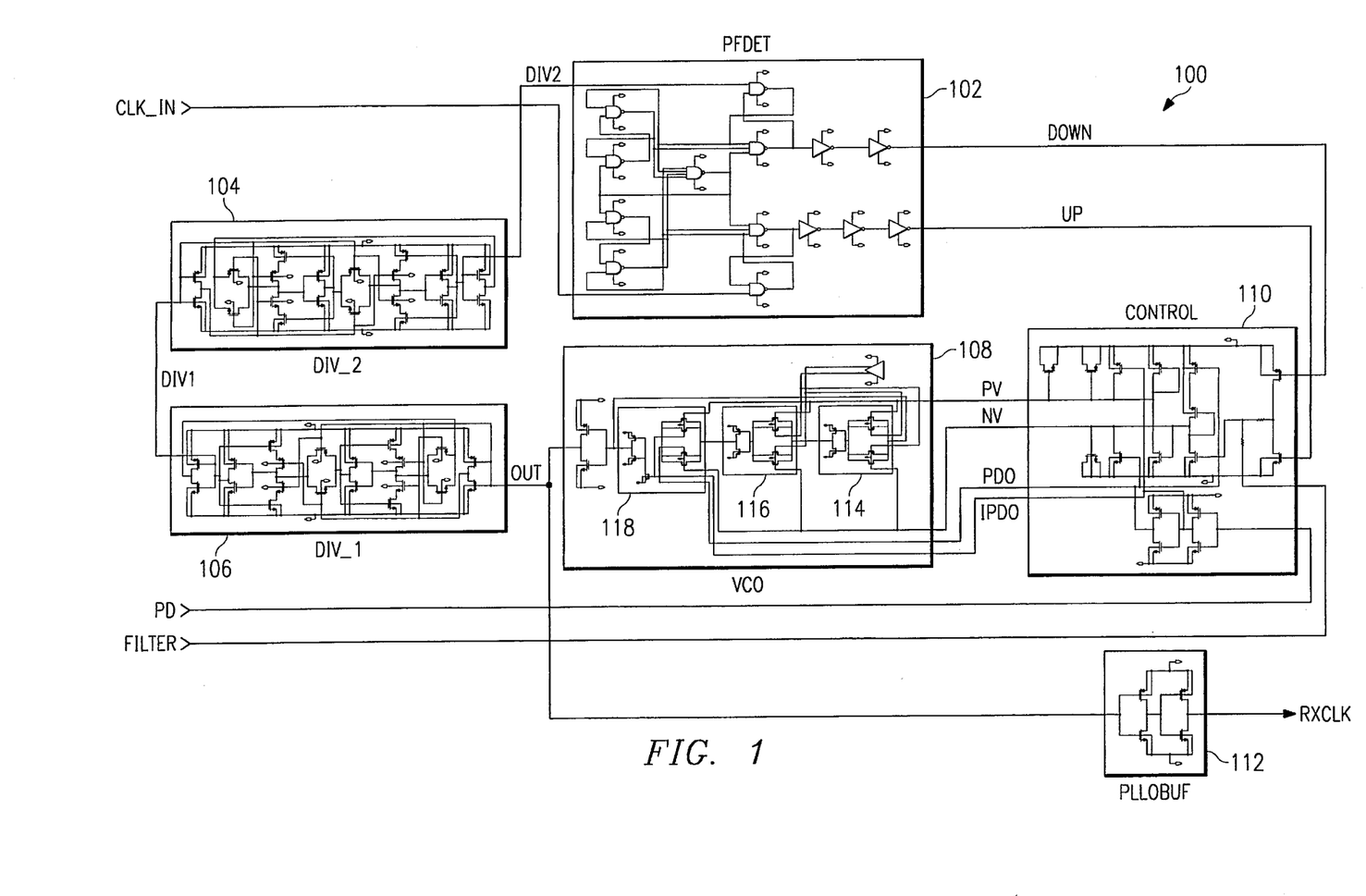
FIG. 1 illustrates an electrical schematic circuit diagram of a preferred embodiment of a phase-locked loop circuit according to the teachings of the present invention.

FIG. 1 illustrates an electrical schematic circuit diagram of a preferred embodiment of a phase-locked loop circuit according to the teachings of the present invention. Preferably, the phase-locked loop circuit of FIG. 1 may be fabricated on a single integrated circuit chip, but the present invention is not intended to be so limited. Phase-locked loop ("PLL") circuit 100 includes phase-frequency detector ("PFDET") circuit 102, which functions to detect a phase and/or frequency difference between input signals CLK_IN and PLL_IN. In a preferred embodiment, PLL circuit 100 receives a 25 Mhz CLK_IN signal and outputs a 100 Mhz signal as signal RXCLK. Depending on the sign (+ or −) of any phase and/or frequency difference between signals CLK_IN and PLL_IN, PFDET circuit 102 outputs an error signal on a respective line DOWN or UP. The error signal (DOWN or UP) is coupled to a respective input P or N of control circuit 110. Control circuit 110 functions to convert the digital error signals at inputs P or N to a respective analog control voltage PV or NV, which may be coupled to the frequency control inputs of voltage-controlled oscillator ("VCO") circuit 108. The control voltage input to VCO circuit 108 causes the VCO circuit to shift the frequency of the signal OUT in the direction required to cancel the phase/frequency error detected by PFDET 102. The signal OUT from VCO circuit 108 is coupled to divider circuit 106, which functions to divide the signal OUT by two. The signal DIV1 output from divider circuit 106 is then coupled to divider circuit 104, which also divides signal DIV1 by two to produce output signal DIV2. Therefore, given the overall division by four, the frequency of signal DIV2 (e.g., 25 MHz) should be equal to that of the CLK_IN input signal, if no phase/frequency error exists between the two signals. The signal OUT from VCO circuit 108 is coupled to PLL output buffer ("PLLOBUF") circuit 112, and is provided at the output of the PLL circuit as signal RXCLK. As described in detail below, in accordance with an aspect of the present invention, signal PD is a "power down" signal that may be coupled to the PD input connection of control circuit 110. The power down signal is activated when signal PD is "high". According to another aspect of the invention, which will be described in detail below, an input line designated as "FILTER" is connected to a 0.001 µf capacitor (not explicitly shown) that is located externally to the integrated circuit chip.

Figure 2:
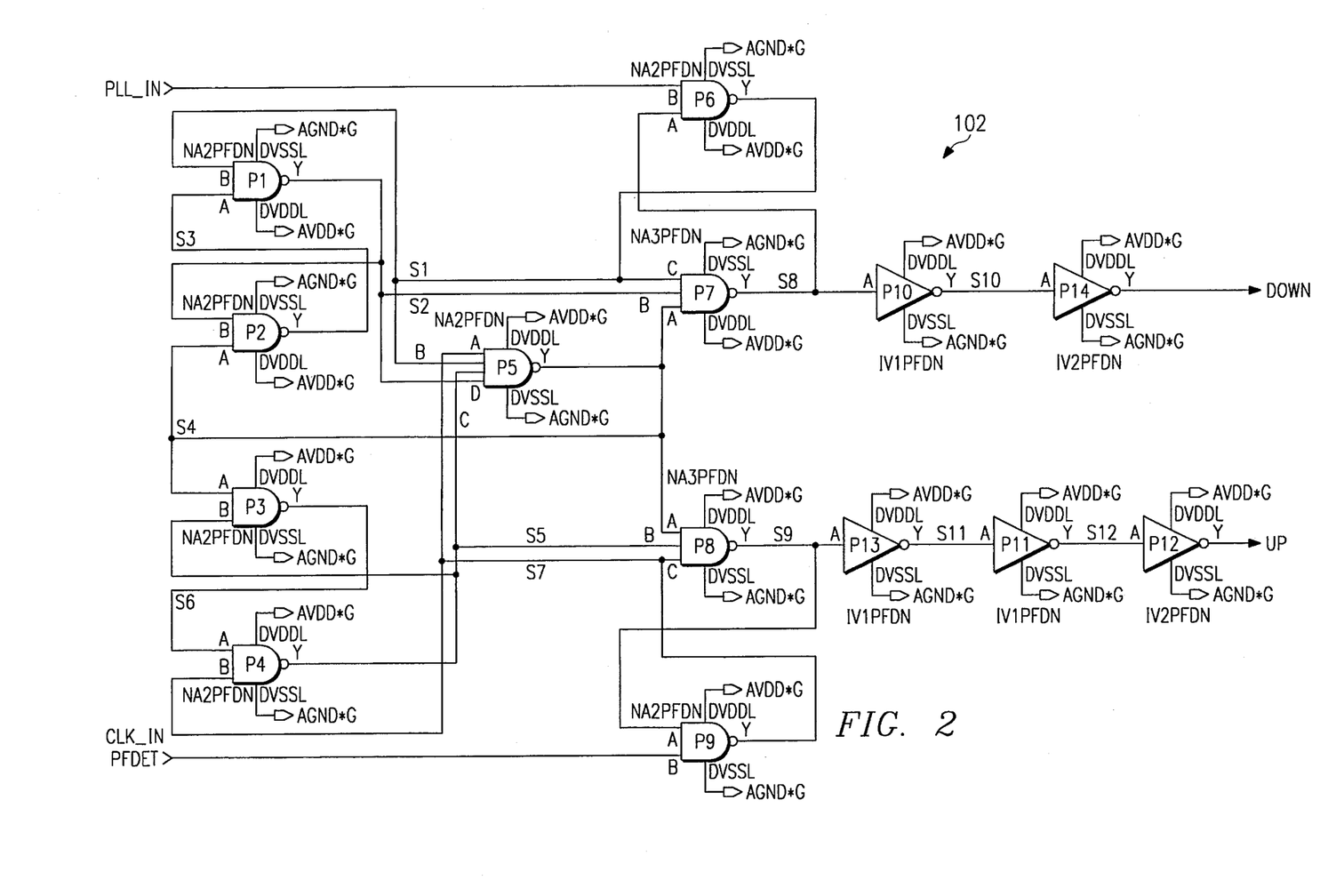
FIG. 2 is an electrical schematic circuit diagram of phase/frequency detector (PFDET) circuit 102 shown in FIG. 1.

FIG. 2 is an electrical schematic circuit diagram of phase/frequency detector (PFDET) circuit 102 shown in FIG. 1. PFDET circuit 102 includes NAND gates P1–P9, whereby each of the pairs P1–P2, P3–P4, P6–P7 and P8–P9 are connected as respective digital, toggle flip-flop circuits. As shown in FIG. 2, a preferred embodiment of the invention may use NA2PFDN, NA3PFDN and NA4PFDN NAND gates manufactured by Texas Instruments Inc. for NAND gates P1–P9. Depending on the sign of the phase difference (over a range of 360°) between input signals PLL_IN and CLK_IN, either NAND gate P7 or P8 may output respective signal S8 or S9. Signal S8 is inverted once by inverter P10 and again by inverter P14 to produce error signal "DOWN" having one polarity. Signal S9 is inverted three times by the sequence of inverters P13, P11 and P12 to produce error signal "UP" having the opposite polarity to that of error signal "DOWN". As shown in FIG. 2, a preferred embodiment of the invention may use 1V1PFDN and 1V2PFDN inverters manufactured by Texas Instruments Inc. for inverters P10–P14.

Figure 3:
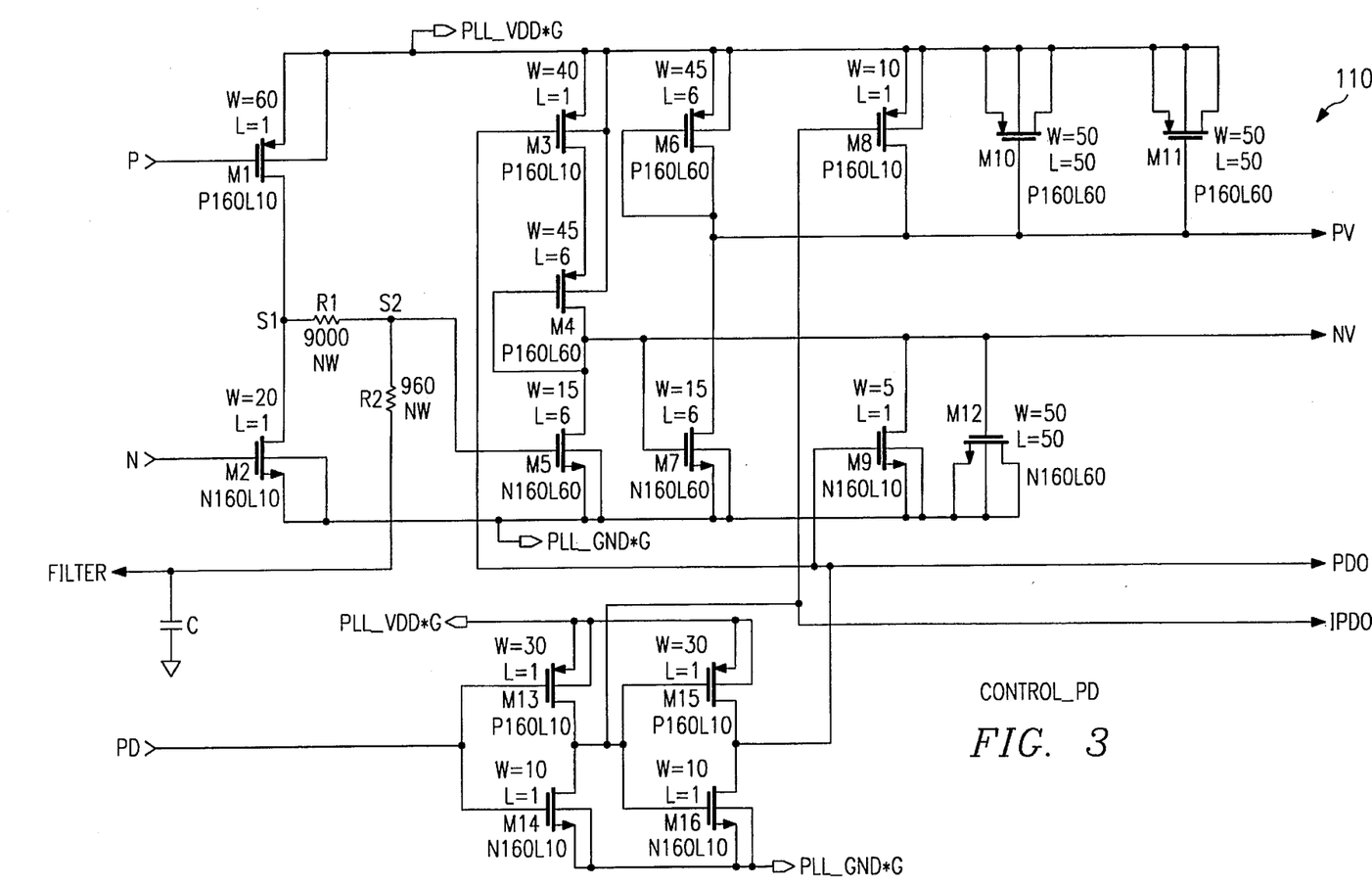
FIG. 3 is an electrical schematic circuit diagram of control circuit 110 shown in FIG. 1.

FIG. 3 is an electrical schematic circuit diagram of control circuit 110 shown in FIG. 1. Essentially, control circuit 110 functions to generate control voltages PV and NV at its output connections responsive to respective P (DOWN) and N (UP) digital, error signals coupled to the input connections of the control circuit. Only one of the P or N signals is active at one time. As mentioned above, an external 0.001 µf capacitor (not explicitly shown) may be connected to the FILTER input connection of control circuit 110. In one aspect of the invention, resistors R1 and R2 may be connected to the external filter capacitor to create a lag-lead filter network that operates to filter the digital signals P and N input from PFDET circuit 102, and thereby increase the stability of control circuit 110. Consequently, the overall frequency stability of PLL circuit 100 is increased. In a typical configuration, transistors M1–M2, M4–M7 and M10–M12 may be used to generate control voltages PV or NV from digital input signals P or N. For example, if digital signal P is input to the gate of transistor M1, then M1 turns on and signal S1 at the drain goes positive. Signal S1 is filtered by the aforementioned combination of resistors R1 and R2 and the external filter capacitor, and goes positive as signal S2. Positive-going signal S2 is applied to the gate of transistor M5, which turns M5 on. As the gate voltage on transistor M5 increases, the drain voltage on M5 decreases. The decreasing drain voltage on M5 is coupled to the NV output connection and the gate of transistor M7. Consequently, the drain voltage of transistor M7 increases. The increasing drain voltage of transistor M7 is coupled to the PV output connection. Therefore, the output control voltages NV and PV are always 180° out of phase. So, as output control voltage NV increases, control voltage PV decreases, and vice versa. Transistors M10–M11 and M12 function as capacitive filters on respective outputs PV and NV. As described below, the output signal at connection PDO is a buffered, non-inverted version of the digital, power down input signal at connection PD. The output signal at connection IPDO is a buffered, inverted version of the digital signal at connection PD.

In an important aspect of the present invention, transistors M3, M8–M9, and M13–M16 may be provided in control circuit 110 to eliminate current draw during a "power down" operation of the circuit. In a preferred embodiment, the gate of transistor M3 is connected to the gate of transistor M9, the drains of transistors M15 and M16, and output connection PDO. The source of transistor M3 is connected to the $V_{DD}$ power supply, and the drain is connected to the source of transistor M4. The source and back gate of transistor M8 are connected to $V_{DD}$, and the drain is connected to output connection PV. The gate of transistor M8 is connected to the drains of transistors M13 and M14, the gates of transistors M15 and M16, and output connection IPDO. The source and back gate of transistor M9 are connected to circuit ground, and the drain is connected to output connection NV. The gates of transistors M13 and M14 are connected to input connection PD. The sources and back gates of transistors M13 and M15 are connected to $V_{DD}$, and the sources and back gates of transistors M14 and M16 are connected to circuit ground.

In operation, a "power down" signal may be activated ("high") at connection PD, which turns on transistor M14. Transistors M13 and M14 function as a digital inverter. Consequently, the drains of transistors M13 and M14 are "low," as well as the signal at output connection IPDO As a result, transistors M8 and M15 are turned on. Transistors M15 and M16 function as a simple, digital inverter, so the signal at output connection PDO is "high". Similar to the operation of transistors M13 and M14, the drains of transistors M15 and M16 are at $V_{DD}$ ("high"). Consequently, transistor M3 is turned off, and transistor M9 is turned on, and the signal at output connection PDO is "high". Therefore, during a "power down" operation, transistor M3 is turned off, while transistors M8–M9 and M14–M15 are always turned on. Since transistor M3 is turned off, no current flows in transistors M4 or M5, since they are in series with transistor M3. The signal at output connection PV is pulled "high" by transistor M8, which turns off transistor M6. The signal at output connection NV is pulled "low" by transistor M9, which turns off transistor M7. Transistors M1 and M2 are not on at the same time, so there is no DC current flow in either of these transistors. As a consequence of the above-described operations, no transistors in control circuit 110 draw any DC current whenever the signal at input connection PD is "high". Therefore, the present invention functions to eliminate all current draw (except for leakage current) from control circuit 110.

Figure 4:
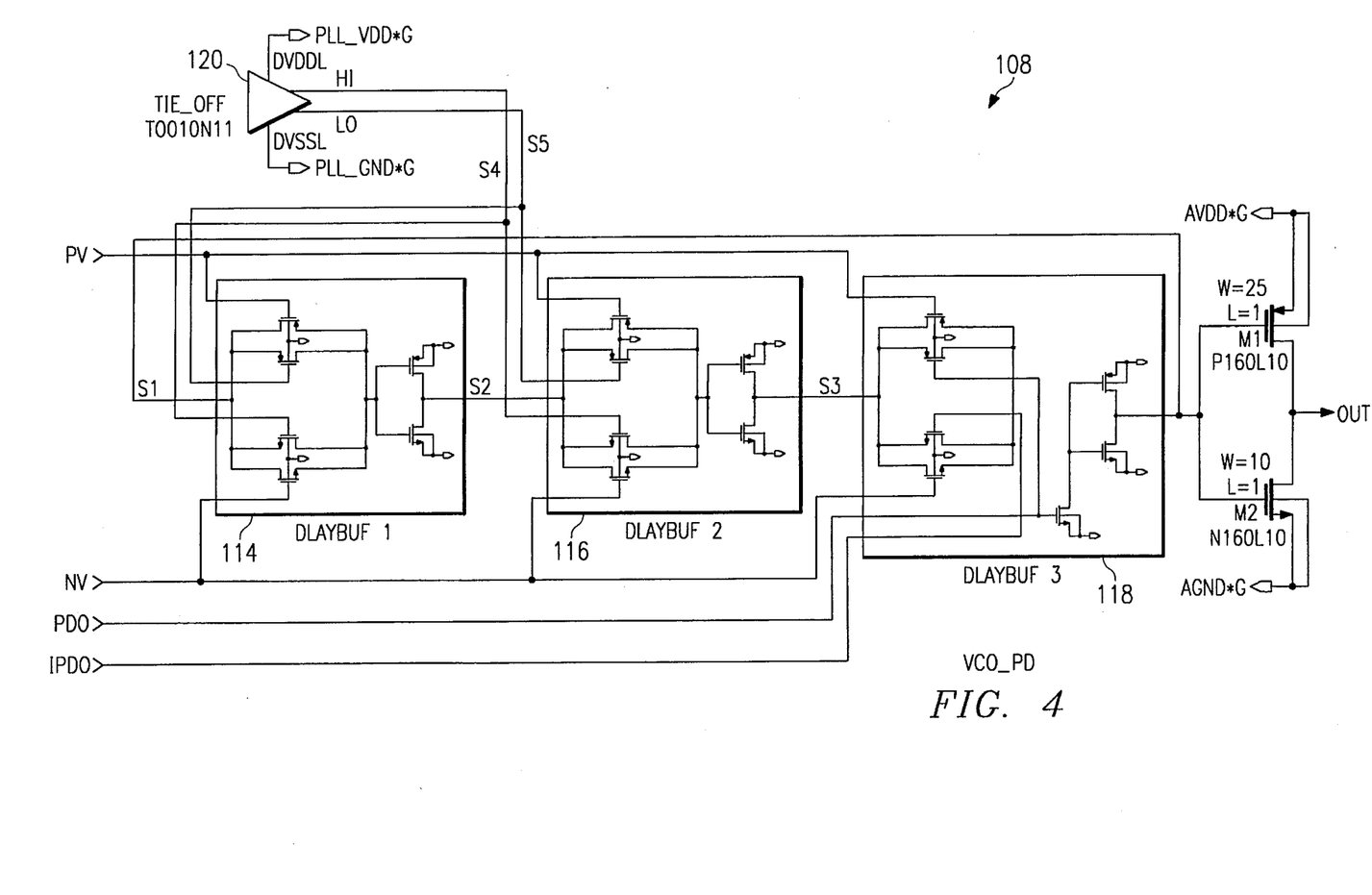
FIG. 4 is an electrical schematic circuit diagram of voltage-controlled oscillator (VCO) circuit 108 shown in FIG. 1.

FIG. 4 is an electrical schematic circuit diagram of voltage-controlled oscillator (VCO) circuit 108 shown in FIG. 1. Generally, a VCO circuit may be structured as a CMOS ring oscillator including an odd number of inverters tied together in a ring. A transmission gate may be inserted in the chain between each inverter in the ring to control the frequency of oscillation. As a voltage is varied at the input of a transmission gate, the impedance of the transmission gate varies. As the impedance of the transmission gate varies, the preceding transmission gate views the following transmission gate as an R-C network, with the R value being the impedance of the following transmission gate and the C value being the gate capacitance of the transistor following the transmission gate. In a preferred embodiment of the present invention, a parallel transmission gate is added to each transmission gate in the ring. The parallel transmission gates are hard wired so that they are turned on all of the time.

Figure 7:
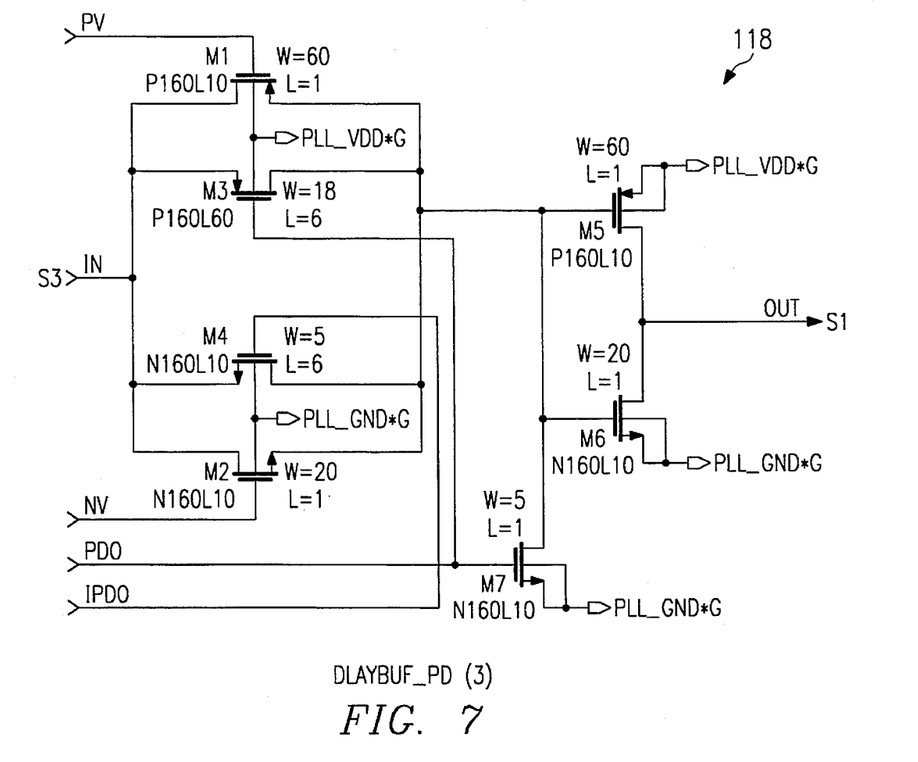
FIG. 7 is an electrical schematic circuit diagram of delay buffer circuit 118 shown in FIGS. 1 and 4.

Specifically, referring to a preferred embodiment of the invention as shown in FIG. 4, VCO circuit 108 includes delay buffers 114, 116 and 118, each of which includes the above-described transmission gates and inverters structured as a ring oscillator. The "ring" of inverters and transmission gates is chained together by signal lines S1, S2 and S3. The "HI" output connection of amplifier 120 is connected to the TOH input connections of delay buffers 116 and 118, and the "LO" output connection is connected to the TOL input connections of delay buffers 116 and 118. Amplifier 120 functions to provide both a continuous "high" output signal and continuous "low" output signal. In a preferred embodiment, amplifier 120 may be used to improve the electrostatic discharge (ESD) performance of the VCO circuit. However, the invention is not intended to be so limited, and it would be within the scope of the invention to tie the TOH input connections to $V_{DD}$, and the TOL input connections to circuit ground. The overall, operating frequency of VCO circuit 108 may be determined by the number of "DLAY-BUF" cells used in the circuit, and the center frequency generated at output connection "OUT" may be tuned by application of control voltages PV and NV that are received from control circuit 110. In a preferred embodiment, decreasing control voltage PV to delay buffers 114, 116 and 118, and increasing control voltage NV, will drive the frequency of the output signal of VCO circuit 108 "up". The combination of transistors M1 and M2 function as a buffer between delay buffer 118 in the ring oscillator and circuitry external to the output of VCO circuit 108. Power down signals PDO and IPDO (the inverse of PDO) may be coupled from control circuit 110 to corresponding input connections PDO and IPDO at delay buffer 118. The details of delay buffers 114, 116 and 118 are shown in FIGS. 5 and 7.

Figure 5:
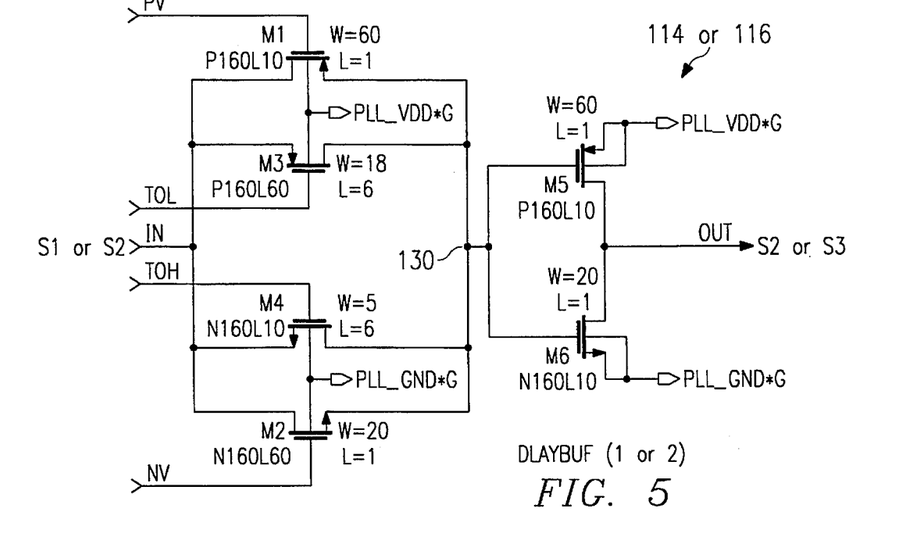
FIG. 5 is an electrical schematic circuit diagram of either delay buffer circuit 114 or 116 shown in FIGS. 1 and 4.

FIG. 5 is an electrical schematic circuit diagram that may represent either delay buffer circuit 114 or 116 shown in FIGS. 1 and 4. In a preferred embodiment, delay buffer circuits 114 and 116 may be identically structured cells, but the invention is not intended to be limited to identical structures. Control voltage input connection PV is connected to the gate of transistor M1, and control voltage input connection NV is connected to the gate of transistor M2. Signal input connection S1 (or S2) is connected to the drains of transistors M1 and M2, and the sources of transistors M3 and M4. The TOL input connection is connected to the gate of transistor M3, and the TOH input connection is connected to the gate of transistor M4. The back gates of transistors M1 and M3 are connected to $V_{DD}$, and the back gates of transistors M2 and M4 are connected to circuit ground. The sources of transistors M1 and M2, and the drains of transistors M3 and M4, are all connected together and also to the gates of transistors M5 and M6. The source and back gate of transistor M5 are connected to $V_{DD}$, and the source and back gate of transistor M6 are connected to circuit ground. The drains of transistors M5 and M6 are connected to output connection OUT.

In operation, referring either to delay buffer 114 or 116, a control voltage PV is input continuously from control circuit 110. The signal TOL input from amplifier 120 is applied continuously to ensure that transistor M3 is always turned on. A control voltage NV is also input continuously from control circuit 110. The signal TOH input from amplifier 120 is also applied continuously to ensure that transistor M4 is always turned on. The parallel impedance from transistors M1–M4 generate the R value for the above-described R-C network. The capacitance of the gates of transistors M5 and M6, plus any stray capacitance, form the capacitance of the R-C network. The pairs of transistors M1 and M2 or M3 and M4 each function as the above-described transmission gates included as part of a ring oscillator, and transistors M5 or M6 each function as one of the above-described inverters also included as part of the ring. The frequency of operation of a delay buffer (and VCO circuit) is controlled by the above-described RC time constant.

Control voltages PV and NV are analog signals, which are applied continuously to the respective PV and NV inputs to the delay buffers. Each of the control voltages will be at a steady state DC value, when PLL 100 is in a "lock" condition. As control voltage PV increases, control voltage NV decreases, and vice versa. For example, if control voltage PV is at 4 volts, NV will be at 1 volt, in a 5 volt system. Alternatively, if PV is at 4 volts, then NV will be at 1 volt. PV and NV may be equal as their values cross at some point near the mid-supply point. With control voltages PV and NV applied to the respective PV and NV inputs of the delay buffers, the impedance of transistors M1 and M2 will vary proportionally to the magnitude of the control voltages. Consequently, the rate of charging or discharging from stage to stage in the ring oscillator is controlled, which functions to control the frequency of oscillation of VCO 108.

As described above, an important aspect of the present invention includes an arrangement which hard wired transistors M3 and M4 so that each of transistors M3 and M4 is turned on all of the time. Consequently, VCO circuit 108 may continuously oscillate and provide an output signal regardless of the magnitude of control voltage PV or NV. Specifically, if transistors M3 and M4 were not included in VCO circuit 108, then VCO circuit 108 would not oscillate if control voltage PV were to go to a positive rail while control voltage NV were to go to a negative rail. In other words, transistors M3 and M4 are each arranged advantageously to provide a parallel current flow path for the input signal from connection IN, if respective transistors M1 and M2 are turned off as a consequence of a control voltage PV or NV being at a respective rail. Such a condition may exist, for example, as a consequence of using a particular phase/frequency detector design for PFDET 102, or during power up of PLL circuit 100.

Another important aspect of the present invention includes an arrangement to size transistors M3 and M4 (i.e., tailor their performance characteristics) so that the gain of VCO circuit 108 may be the minimum gain that is required to lock the operating frequency of PLL circuit 100, over a predetermined range of process and operating conditions. A major advantage of operating with the gain of VCO circuit 108 at a minimum, is that "noise" provided at input connections PV or NV will result in minimized jitter or frequency shift at the output of VCO circuit 108. In a preferred embodiment, transistors M1 and M2 may be sized for the worst case "slow corner," and transistors M3 and M4 may be sized for the worst case "fast corner." The effects of such an arrangement may be illustrated by FIGS. 6(a) and (b).

First, an explanation is in order to clarify what is meant by a "slow corner" or "fast corner". There may be several process and operating conditions that can affect the performance of a VCO circuit. For example, the tolerances on the external supply voltage may be large enough to cause performance variations of the VCO, and specifically, a change in the VCO's frequency of operation. In another situation, the circuit may be subject to temperature extremes during normal operation. This condition may also cause variations in circuit performance, and specifically, VCO frequency variations. Another condition that may cause performance variations may be variations in the gain of the transistors, which can differ over a range of process tolerances. There are numerous other factors that may influence the performance of a VCO circuit. Each of these factors may be independent of others, so all possible combinations of factors need to be taken into account during the design and fabrication processes. Each combination of factors is referred to as a "corner". For example, a certain combination of factors may result in a VCO circuit operating at some maximum frequency for a given control voltage input. Such a combination is referred to as a "fast corner". Similarly, another combination of factors may result in a VCO circuit operating at some minimum frequency for a given control voltage input, which is referred to as a "slow corner". For optimum performance, it is necessary to provide the control voltages with enough range to be able to tune the VCO to a desired frequency of operation for both the "fast corner" and "slow corner".

Figure 6A:
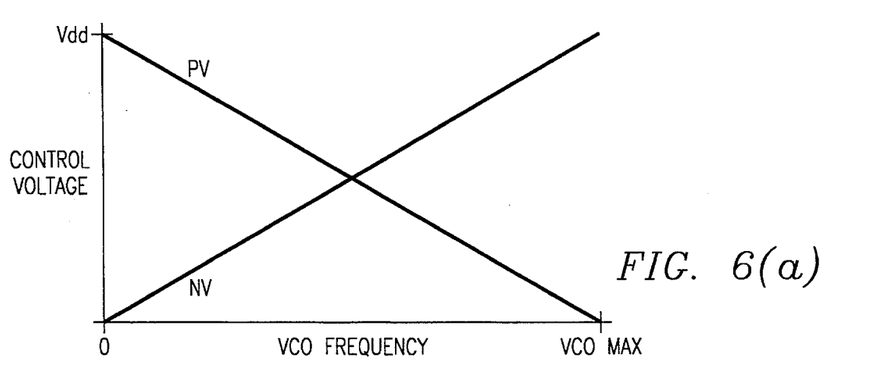
FIG. 6(a) illustrates representative output frequencies of an exemplary VCO circuit that does not include transmission gates M3 (parallel to M1) and M4 (parallel to M2).
Figure 6B:
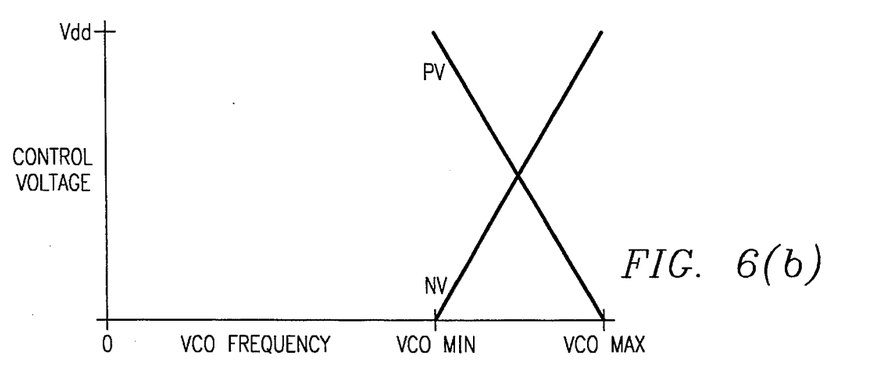
FIG. 6(b) illustrates representative output frequencies of VCO circuit 108, which includes parallel transmission gates M3 and M4 in accordance with the teachings of the present invention.

FIG. 6(a) illustrates representative output frequencies of an exemplary VCO circuit that does not include transmission gates M3 (parallel to M1) and M4 (parallel to M2). As shown by FIG. 6(a), when control voltage NV is at zero (0) volts (e.g., at a rail), and control voltage PV is at $V_{DD}$ (also at a rail), the VCO circuit is turned off and does not oscillate (i.e., the output frequency is zero). At the other extreme, when control voltage NV is at an opposite rail ($V_{DD}$) and control voltage PV is at zero (0) volts, then the VCO circuit oscillates at the maximum frequency. However, this VCO circuit must be designed to allow oscillation at the proper frequencies under the worst case "slow conditions." Consequently, the gain of the VCO circuit represented by FIG. 6(a) will be equal to VCO Max/$V_{DD}$ (MHz/Volt).

FIG. 6(b) illustrates representative output frequencies of VCO circuit 108, which includes transmission gates M3 and M4 in parallel with respective transmission gates 1 and 2, in accordance with the teachings of the present invention. As shown by FIG. 6(b), if control voltage PV is at $V_{DD}$ (e.g., +5 volts), and control voltage NV is at zero (0) volts, then VCO circuit 108 would oscillate at the minimum frequency (VCO Min). On the other hand, if control voltage PV were to be at the opposite rail (zero volts), and control voltage NV were to be at $V_{DD}$, then VCO circuit 108 would still oscillate but now at frequency VCO Max. In comparing the operation of VCO circuit 108 with the operation of the VCO circuit represented by FIG. 6(a), VCO circuit 108 may continue to oscillate when the control voltages are at either rail. However, the VCO circuit without parallel transmission gates M3 and M4 will not oscillate if control voltage PV is at $V_{DD}$ and control voltage NV is at zero (0) volts. In accordance with a preferred embodiment of the invention, the operating point of VCO Min may be selected for optimum operation by sizing transmission gates M3 and M4 so that VCO 108 will be "slow" enough to oscillate at a desired frequency, for the worst case "fast" condition. Transmission gates M1 and M2 would be sized so that VCO 108 will be "fast" enough to oscillate at a desired frequency, for the worst case "slow" condition. Importantly, the gain of VCO circuit 108 may be set equal to (VCO Max–VCO Min)/$V_{DD}$ (MHZ/Volt). Consequently, in comparison with the gain of the VCO circuit represented by FIG. 6(a), the gain of VCO circuit 108 will be significantly lower. Therefore, for example, one (1) millivolt of noise at the input of VCO circuit 108 will cause a significantly smaller variation in the output frequency of VCO 108, compared to the VCO circuit represented by FIG. 6(a). This noise reduction capability of VCO circuit 108 results in a significant reduction in "jitter" at the output of PLL circuit 100, compared to a PLL circuit using the VCO circuit represented by FIG. 6(a).

FIG. 7 is an electrical schematic circuit diagram of delay buffer circuit 118 shown in FIGS. 1 and 4. Except for the inclusion of transistor M7 in FIG. 7, the structure and operation of delay buffer circuit 118 may be considered virtually identical to the structure and operation of delay buffers 114 or 116 shown in FIG. 5. Importantly, however, transistor M7 has been added in accordance with an aspect of the invention, which functions advantageously to allow the complete shut down of PLL circuit 100 so that no appreciable current (except for leakage current) is drawn off during the shut down operation. Essentially, transistor M7 performs the "power down" function described above with respect to transistors M3, M8–M9, and M13–M16 of control circuit 110 shown in FIG. 3. In a preferred embodiment, power down transistor M7 may be used in delay buffer circuit 118, but the invention is not intended to be so limited. For example, the power down function of the invention may be implemented in VCO 108 by adding transistor M7 to any one of delay buffers 114, 116 or 118. In any event, the power down capability of the present invention may be fully implemented by adding transistor M7 to only one of the delay buffers in VCO circuit 108. Specifically, referring to FIG. 7, the power down signal PDO input from control circuit 110 (FIG. 3) is coupled to the gates of transistors M3 and M7. The power down signal IPDO (inverse of PDO) input from control circuit 110 is coupled to the gate of transistor M4. The back gate and source of transistor M7 are connected to circuit ground. The drain of transistor M7 is connected to the gates of transistors M5 and M6, the drains of transistors M3 and M4, and the sources of transistors M1 and M2.

In operation, for a power down condition, the signal input at connection PDO would be "high," and the signal at input connection IPDO would be "low". The output of transistor M7 holds the input of transistors M5 and M6 "low", which results in a "high" signal at output connection OUT. The "high" signal at output connection OUT forces the input IN of the subsequent delay buffer "high". Essentially, the signal at the output of one delay buffer is coupled to the input of the next delay buffer in the chain. Since there is an odd number of delay buffers in VCO circuit 108, the signal at the input connection IN of delay buffer 118 will be "high". Consequently, during a power down mode of operation, transmission gates M1–M4 must be turned off to keep DC current from flowing through these transistors because of the "high" signal at input IN and the "low" signal coupled to the gates of transistors M5 and M6. Therefore, the active signal at input connection PDO is applied to the gate of transistor M3, and the active signal at input connection IPDO is applied to the gate of transistor M4, to turn off these transistors completely during the power down mode. Simultaneously, as described above with respect to FIG. 3, the power down circuitry in control circuit 110 ensures that transistors M1 and M2 in control circuit 110 are also completely turned off. Therefore, in accordance with the teachings of the present invention, no DC current will flow from either VCO circuit 108 or control circuit 110, during a power down mode of operation.

Figure 8:
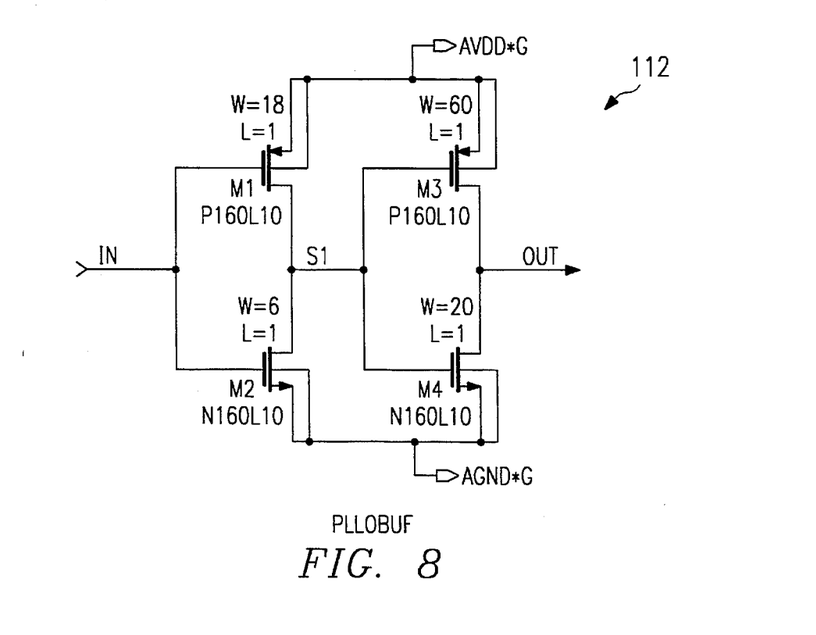
FIG. 8 is an electrical schematic circuit diagram of PLL output buffer circuit 112 shown in FIG. 1.

FIG. 8 is an electrical schematic circuit diagram of PLL output buffer circuit 112 shown in FIG. 1. PLL output buffer circuit 112 functions to provide sufficient power for VCO circuit 108 to drive the external load for the PLL circuit. In a preferred embodiment, PLL output buffer circuit 112 may include P160L10 and N160L10 transistors manufactured by Texas Instruments Inc.

Figure 9:
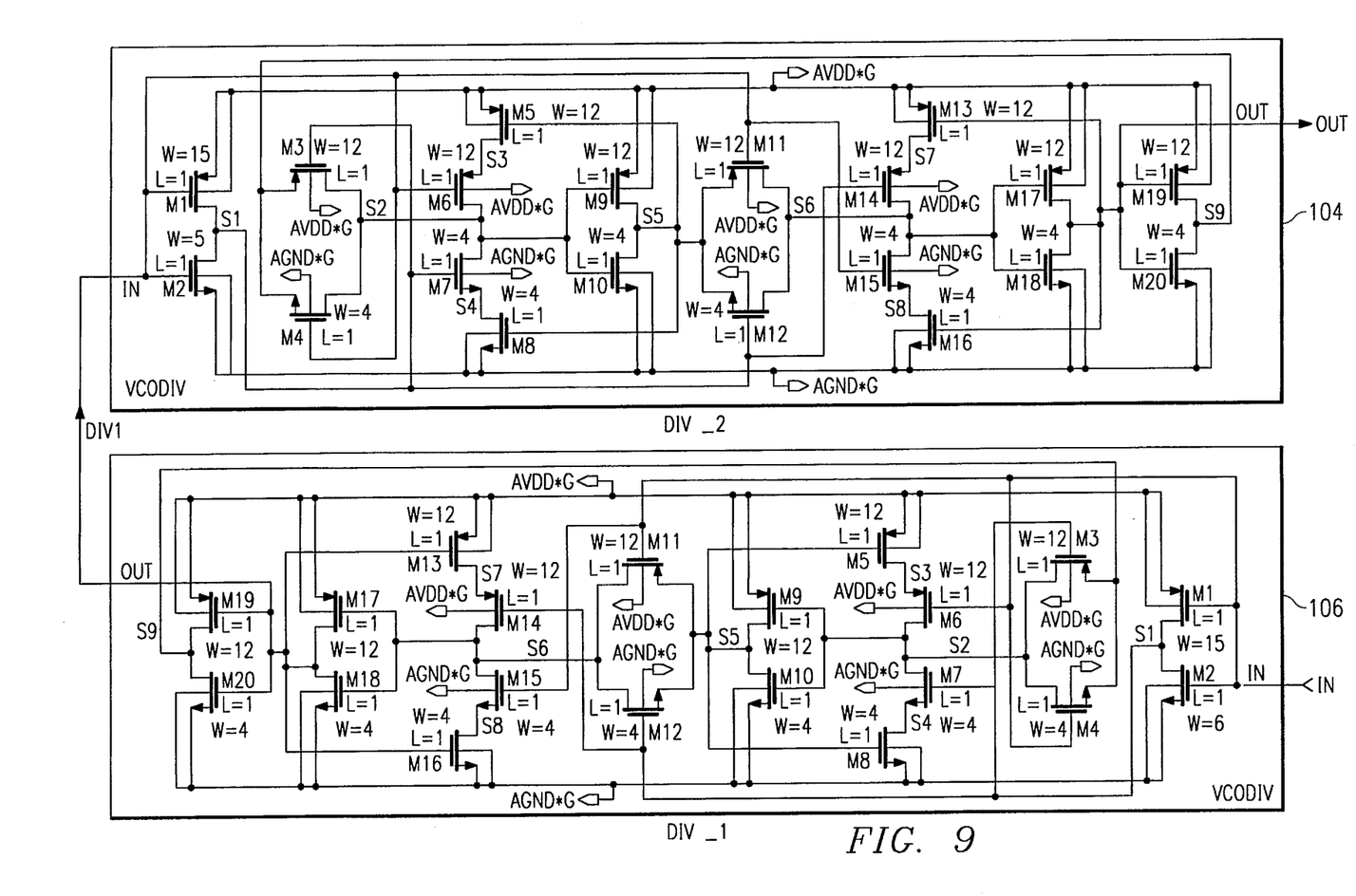
FIG. 9 is an electrical schematic circuit diagram of divider circuits 104 and 106 shown in FIG. 1.

FIG. 9 is an electrical schematic circuit diagram of divider circuits 104 and 106 shown in FIG. 1. In a preferred embodiment, the structure and operation of divider circuits 104 and 106 may be virtually identical. Divider circuits 104 and 106 each function to divide the frequency of an input signal by two. Therefore, the combination of divider circuits 104 and 106 functions as a 4X divider circuit. In the embodiment illustrated by FIG. 9, VCO 108 outputs a 100 MHz signal, which is coupled to the input connection IN of divider circuit 106. Accordingly, a 50 MHz signal is output from divider circuit 106 to the input connection of divider circuit 104. A 25 MHz signal is output from divider circuit 104 at connection OUT. Although divider circuits 104 and 106 may be used in a preferred embodiment, it is within the scope of the present invention to require no divider circuits to operate PLL circuit 100. In such a PLL circuit, no frequency multiplication function would be desired.

Although the present invention and its advantages have been described in detail, it should be understood that various changes, substitutions and alterations can be made herein without departing from the spirit and scope of the invention as defined by the appended claims.

What is claimed is:

1. A phase-locked loop circuit, comprising:
   phase detector circuitry operable to detect a phase difference between a first input signal and a second input signal and generate an error signal responsive to said phase difference;
   control voltage generating circuitry operable to generate a control signal responsive to said error signal;
   oscillator circuitry including at least one delay circuit and operable to generate a high frequency signal responsive to said control signal, said high frequency signal providing at least one of said first and second input signals; and
   power down circuitry connected to said control voltage circuitry and said at least one delay circuit and operable to prevent current drawn from said control voltage circuitry and said at least one delay circuit during a power down mode of operation of said phase-locked loop circuit.

2. The phase-locked loop circuit of claim 1, further comprising a filter circuit connected to an input of said control voltage circuitry and operable to increase the stability of said phase-locked loop circuit.

3. The phase-locked loop circuit of claim 1, wherein said power down circuitry includes a transistor connected to an input of an inverter circuit of said at least one delay circuit.

4. The phase-locked loop circuit of claim 1, wherein said power down circuitry includes a first plurality of transistors connected to an input of a positive control voltage generating circuit and a second plurality of transistors connected to an input of a negative control voltage generating circuit.

5. The phase-locked loop circuit of claim 1, wherein said phase detector circuitry, said control voltage generating circuitry, said oscillator circuitry, and said power down circuitry are fabricated in a single integrated circuit.

6. A voltage controlled oscillator circuit, comprising:
   at least one first transmission gate circuit;
   at least one inverter circuit connected to an output of said first transmission gate circuit; and
   at least one second transmission gate circuit connected in parallel with said at least one first transmission gate circuit and operable to maintain an oscillation of said voltage controlled oscillator circuit over a predetermined range of input control voltages.

7. The voltage controlled oscillator circuit of claim 6, wherein said predetermined range of input control voltages includes a fast corner and a slow corner.

8. The voltage controlled oscillator circuit of claim 6, wherein said at least one first transmission gate circuit includes a first transistor circuit responsive to a positive control voltage and a second transistor circuit responsive to a negative control voltage, and said at least one second transmission gate circuit includes a third transistor circuit responsive to a high input signal and a fourth transistor circuit responsive to a low input signal.

9. A method of generating a high frequency signal using a phase-locked loop circuit, comprising the steps of:
   detecting a phase difference between a first input signal and a second input signal and generating an error signal responsive to said phase difference;
   generating a control signal with a control signal generator, said control signal being responsive to said error signal;
   generating the high frequency signal with a voltage controlled oscillator, the frequency of said high frequency signal being responsive to said control signal, said high frequency signal providing at least one of said first and second input signals; and
   minimizing the gain of said voltage controlled oscillator so as to minimize jitter at an output of said phase-locked loop.

10. The method of claim 9, wherein the step of minimizing the gain of said voltage controlled oscillator further comprises the step of maintaining a signal flow path through an input stage of said voltage controlled oscillator over a predetermined range of values of said control signal.

* * * * *